United States Patent
Otsuka et al.

(10) Patent No.: US 6,930,946 B2
(45) Date of Patent: Aug. 16, 2005

(54) REFRESH CONTROL AND INTERNAL VOLTAGE GENERATION IN SEMICONDUCTOR MEMORY DEVICE

(75) Inventors: Eitaro Otsuka, Fujimi-machi (JP); Koichi Mizugaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/826,365

(22) Filed: Apr. 19, 2004

(65) Prior Publication Data

US 2005/0002254 A1 Jan. 6, 2005

(30) Foreign Application Priority Data

Apr. 21, 2003 (JP) ........................................ 2003-115351

(51) Int. Cl.⁷ ................................................. G11C 7/00
(52) U.S. Cl. .................. 365/222; 365/236; 365/189.09
(58) Field of Search ................................ 365/222, 236, 365/189.09

(56) References Cited

U.S. PATENT DOCUMENTS

| | | | | |
|---|---|---|---|---|
| 5,774,404 A | * | 6/1998 | Eto ........................ | 365/189.09 |
| 6,028,804 A | | 2/2000 | Leung | |
| 6,404,687 B2 | * | 6/2002 | Yamasaki .................... | 365/222 |
| 6,504,783 B2 | | 1/2003 | Jo | |
| 6,529,426 B1 | * | 3/2003 | Merritt et al. ............... | 365/236 |
| 6,545,943 B2 | | 4/2003 | Mizugaki et al. | |
| 6,646,944 B2 | | 11/2003 | Shimano et al. | |
| 6,721,225 B2 | | 4/2004 | Tsukude | |
| 2002/0060943 A1 | | 5/2002 | Jo | |
| 2003/0185078 A1 | | 10/2003 | Tsukude | |

FOREIGN PATENT DOCUMENTS

| | | |
|---|---|---|
| JP | A 11-297067 | 10/1999 |
| JP | A 2002-150769 | 5/2002 |
| JP | A 2002-170387 | 6/2002 |
| JP | A 2003-297081 | 10/2003 |

* cited by examiner

Primary Examiner—Huan Hoang
(74) Attorney, Agent, or Firm—Oliff & Berridge, PLC

(57) ABSTRACT

The present invention provides a technique of mitigating the long cycle limitation in a semiconductor memory device that requires refresh operation. A semiconductor memory device comprises a refresh controller that executes refresh operation. The refresh controller comprises: a refresh timing signal generator, a refresh request signal generator, and a refresh execution signal generator. The refresh request signal generator comprises: a first counter that counts the number of times the refresh timing signal has been generated; and a second counter that counts the number of times the refresh execution signal has been generated. The refresh request signal generator generates the refresh request signal if a difference of the two number of times of signal generation is one or more. The refresh execution signal generator is capable of generating two or more of the refresh execution signals within one cycle of the refresh timing signal if the difference is two or more.

9 Claims, 13 Drawing Sheets

| | #CS | REFRESH MODE (*) |
|---|---|---|
| OPERATION | L | MODE 1 |
| STANDBY | H | MODE 2 |

(*)

REFRESH MODE 1 : REFRESH OPERATION IS EXECUTED SYNCHRONOUSLY WITH PATD SIGNAL AFTER REFRESH TIMING SIGNAL IS GENERATED IN MEMORY CHIP

REFRESH MODE 2 : REFRESH OPERATION IS EXECUTED IN RESPONSE TO GENERATION OF REFRESH TIMING SIGNAL IN MEMORY CHIP (ADDRESS INPUT UNNECESSARY)

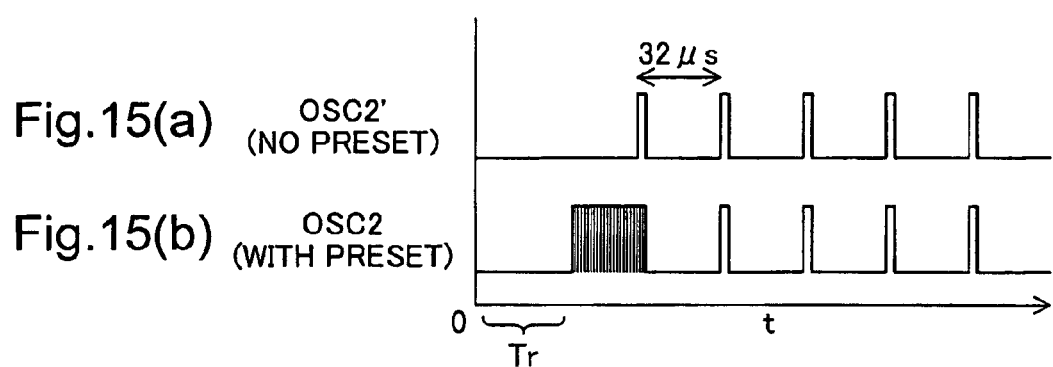

REFRESH CONTROL AND INTERNAL VOLTAGE GENERATION IN SEMICONDUCTOR MEMORY DEVICE

BACKGROUND OF THE INVENTION

1. Field of the Invention

The invention relates to refresh control and internal voltage generation in a semiconductor memory device.

2. Description of the Related Art

DRAM and SRAM are used as semiconductor memory devices. As is well known, DRAMs are cheaper and have a higher capacity than SRAMs, but must be refreshed. On the other hand, SRAMs need not be refreshed and are easier to use, but are more expensive and have a lower capacity than DRAMs.

A virtual SRAM (also termed a VSRAM or a PSRAM) is known as a semiconductor memory device that combines the advantages of a DRAM and an SRAM. A virtual SRAM includes a memory cell array that contains dynamic memory cells similar to those in a DRAM and has a built-in refresh controller, such that the refresh operation is performed internally. As a result, the external device (such as a CPU) connected to the virtual SRAM can access (read or write data to or from) the virtual SRAM without being aware of refresh operations. This feature of a virtual SRAM is known as "refresh transparency".

The virtual SRAM is described in U.S. Pat. No. 6,545,943 B2 disclosed by the applicants, for example.

In order to retain data in each memory cell in a virtual SRAM, each memory cell must be refreshed once within a predetermined period. In the conventional art, one refresh operation is thus performed periodically for the memory cells in each row during each given refresh period.

Specifically, refresh execution for the memory cells in one row is requested in response to the generation of a periodic refresh timing signal issued from a refresh timer. The refresh operation for the memory cells of one row is carried out within one refresh period, i.e., within the period that ends at the generation of the next refresh timing signal, so as not to interfere with external access.

If refresh is carried out once during each refresh period, the period during which external access can be performed continuously is limited to one refresh period. This limitation is termed a "long cycle limitation".

While the long cycle limitation described above exists in a virtual SRAM, there is no long cycle limitation in an SRAM. Therefore, researchers have sought to minimize the effect of this long cycle limitation in a virtual SRAM.

In the conventional semiconductor memory device, the internal voltage is normally generated in the semiconductor memory device using external voltage when power-on processing is executed. However, a drawback of the conventional art is that it takes a substantial amount of time for the internal voltage to reach a predetermined voltage level, i.e., for external access to become enabled.

SUMMARY OF THE INVENTION

The first object of the present invention is thus to provide a technique of mitigating the long cycle limitation in a semiconductor memory device that requires refresh operation. The second object is to provide a technique of causing the internal voltage for a semiconductor memory device to reach a predetermined level relatively quickly.

At least part of the above and the other related objects is attained by a first apparatus of the present invention that is semiconductor memory device. The semiconductor memory device comprises: a memory cell array having dynamic memory cells; and a refresh controller that executes refresh operation for the memory cell array. The refresh controller comprises: a refresh timing signal generator that periodically generates a refresh timing signal used to establish a timing of execution of the refresh operation; a refresh request signal generator that generates a refresh request signal indicating a request for the execution of the refresh operation in response to the refresh timing signal; and a refresh execution signal generator that generates a refresh execution signal indication the execution of the refresh operation in response to the refresh request signal and another signal. The refresh request signal generator comprises: a first counter that counts the number of times the refresh timing signal has been generated; and a second counter that counts the number of times the refresh execution signal has been generated. The refresh request signal generator generates the refresh request signal if a difference between the number of times the refresh timing signal has been generated and the number of times the refresh execution signal has been generated is one or more. The refresh execution signal generator is capable of generating two or more of the refresh execution signals within one cycle of the refresh timing signal if the difference is two or more.

In this apparatus, because the refresh controller has the two counters, the refresh operation can be delayed a plurality of times. Further, because the refresh controller can generate two or more of the refresh execution signals within one cycle of the refresh timing signal, a delayed refresh operation can be executed later. As a result, the long cycle limitation can be mitigated.

In the above apparatus, it is preferable that the semiconductor memory device further comprises: an external access controller that executes an external access operation with respect to a memory cell specified using an external address that is given by an external device, the external address including a row address and a column address. It is also preferable that if only a predetermined bit included in the column address changes, the external access controller maintains a word line selected by the row address in an active state. Furthermore, it is preferable that if the word line is maintained in the active state, the refresh controller delays the generation of the refresh execution signal until a bit other than the predetermined bit included in the external address changes.

The advantage of the present invention is considerable if the external access controller carries out so-called "page mode access", and page mode access can be performed efficiently.

In the above apparatus, it is preferable that if the refresh execution signal is delayed two or more times, the refresh controller sequentially generates the refresh execution signals each time the bit other than the predetermined bit included in the external address changes in a first operation mode in which the external access operation is enabled. It is also preferable that the refresh controller continuously generates the refresh execution signals in a second operation mode in which the external access operation is prohibited.

With this arrangement, a delayed refresh operation can be executed later in both the first operation mode and the second operation mode. In the second operation mode in particular, because refresh execution signals are generated continuously, delayed refresh operations can be executed quickly.

In the above apparatus, the number of bits in the second counter is set to match the number of rows included in the memory cell array, and the refresh controller uses an output value from the second counter as a refresh address to specify a row in the memory cell array.

With this arrangement, because a separate refresh address generator is not required, a refresh controller can be configured using a relatively simple construction.

In the above apparatus, the number of bits in the first counter may be set to a number smaller than the number of bits in the second counter, and the refresh request signal generator may generate the refresh request signal using an output from the first counter and a part of an output from the second counter.

With this arrangement, the circuitry of the refresh controller can be reduced in size.

In the above apparatus, the semiconductor memory device may further comprise: an internal voltage generator that includes a charge pump circuit and generates internal voltage for the semiconductor memory device using voltage supplied externally. The internal voltage generator may generate the internal voltage using the refresh execution signals supplied from the refresh execution signal generator.

If the internal voltage is generated using the refresh execution signal as described above, the internal voltage generator can efficiently supplement the electric charge required for the refresh operation.

In the above apparatus, the refresh controller may further comprises: a setting section that sets the output values from the two counters to different values when power-on processing is executed for the semiconductor memory device. The refresh controller may continuously generate the refresh execution signals when the power-on processing is executed until the output values from the two counters match.

In this arrangement, because the refresh controller can continuously supply refresh execution signals to the internal voltage generator when power-on processing is executed, the internal voltage can be reached to a predetermined voltage level relatively quickly.

A second apparatus of the present invention is a semiconductor memory device. The semiconductor memory device comprises: an internal voltage generator that includes a charge pump circuit and generates internal voltage for the semiconductor memory device using voltage supplied externally; and a pulse signal supply section that supplies pulse signals to the internal voltage generator. The pulse signal supply section comprises: an output section that outputs a predetermined value when power-on processing for the semiconductor memory device is executed; and a pulse signal counter that counts the number of times the pulse signal has been generated. The pulse signal supply section continuously generates the pulse signals when the power-on processing is executed until an output value from the output section matches an output value from the pulse signal counter.

In this apparatus, because the pulse signal supply section can continuously supply pulse signals to the internal voltage generator when power-on processing is executed, the internal voltage can be reached to the predetermined voltage level relatively quickly.

In the above apparatus, it is preferable that the output section comprises: a periodic signal counter that counts the number of times a predetermined periodic signal has been generated; and a setting section that sets an output value from the periodic signal counter to the predetermined value.

The semiconductor memory device further comprises: a memory cell array having dynamic memory cells. Further, it is preferable that the periodic signal counter and the pulse signal counter are counters used for the execution of the refresh operation regarding the memory cell array after the power-on processing is completed.

As described above, if the two counters used for the execution of refresh operation after power-on processing is completed are used as the two counters for the pulse signal supply section during power-on processing, the circuitry of the semiconductor memory device can be reduced in size.

Furthermore, the present invention may be realized in various forms, and may be realized in such forms as a semiconductor memory device, a semiconductor memory system that includes a semiconductor memory device and a control device, a control method for a semiconductor memory device, or an electronic apparatus that includes a semiconductor memory device, for example.

These and other objects, features, aspects, and advantages of the present invention will become more apparent from the following detailed description of the preferred embodiments with the accompanying drawings.

BRIEF DESCRIPTION OF THE DRAWINGS

FIGS. 15(a) and 15(b) are explanatory drawings showing second oscillation signals.

DESCRIPTION OF THE PREFERRED EMBODIMENTS

An exemplary embodiment of the present invention is described in the following order.

Figures 1, 2:
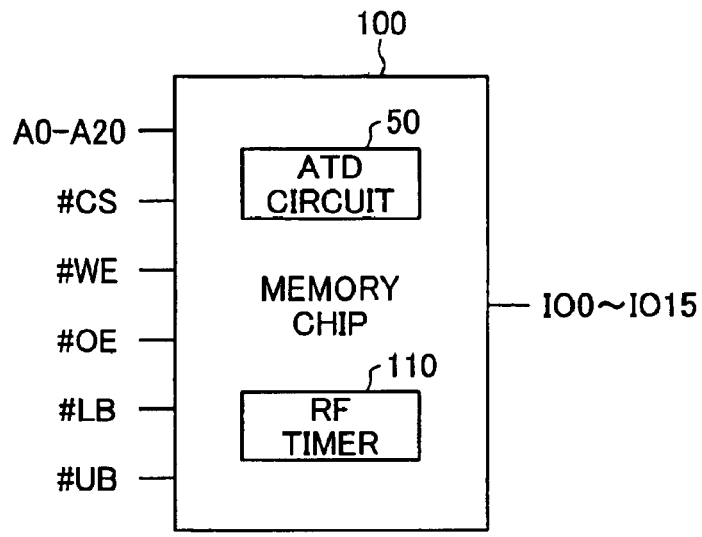
FIG. 1 is an explanatory drawing showing terminal construction of a memory chip 100 in accordance with a first embodiment.
FIG. 2 is an explanatory drawing showing different operating state of the memory chip 100 according to signal level of chip select signal #CS.

A. First Embodiment
  A-1. Summary of Memory Chip Terminal Construction and Operating States
  A-2. General Internal Construction of Memory Chip
  A-3. Internal Construction of Refresh Controller
  A-4. Refresh Operation
B. Second Embodiment
A. First Embodiment:
  A-1. Summary of memory chip terminal construction and operating states: FIG. 1 is an explanatory drawing showing the terminal construction of a memory chip 100 in accordance with a first embodiment. The memory chip 100 has the terminals listed below.
A0–A20: Address input terminals (21)
CS: Chip select input terminal
WE: Write enable input terminal
OE: Output enable input terminal
LB: Lower byte enable input terminal
UB: Upper byte enable input terminal
IO0–IO15: I/O data terminals (16)

In the description below, the same symbols are used for terminal names and signal names. A symbol "#" preceding a terminal name (or signal name) denotes negative logic. While a plurality of address input terminals A0–A20 and I/O data terminals IO0–IO15 are provided, these are depicted in simplified fashion in FIG. 1.

The memory chip 100 is constructed as a virtual SRAM (VSRAM) that can be accessed using the same procedure as an ordinary asynchronous SRAM. However, because it uses dynamic memory cells, unlike an SRAM, it must be refreshed at predetermined intervals. A refresh controller with an integrated refresh timer 110 is thus built into the memory chip 100. In this Specification, the operation to read or write data performed by an external device (control device) is termed "external access", while the refresh operation performed by the integrated refresh controller is termed "internal refresh" or simply "refresh".

The 21-bit address A0–A20 specifies a two megaword address. The I/O data IO0–IO15 represents 16 bits of data for one word. Namely, one value of the address A0–A20 corresponds to 16 bits (one word), and the 16 bits of I/O data IO0–IO15 can be input or output at one time. As can be understood from this description, the memory chip 100 has memory cells with a 32 megabit capacity.

The memory chip 100 of this embodiment is constructed such that it can perform page mode access. Page mode access as defined here is a mode in which the data for a plurality of pages can be read or written relatively rapidly by sequentially changing the active column address while maintaining the row address at a specified value. In this embodiment, in the 21-bit address A0–A20, the upper 12-bit address, i.e., A9–A20, is a row address, and the lower 9-bit address, i.e. A0–A8, is a column address. Furthermore, in the column address A0–A8, the lower 3-bit address, i.e., A0–A2, are used as a page address. Page mode access is implemented by changing the page address A0–A2 without changing the upper 18-bit address A3–A20.

An address transition detection circuit (ATD circuit) 50 for detecting a change in an address is disposed inside the memory chip 100. The address transition detection circuit 50 outputs two types of address transition signals. Specifically, if one or more bits of the 21-bit address A0–A20 has changed, a whole address transition signal (referred to as a "WATD signal" below) is generated. If one or more bits of the upper 18-bit address A3–A20, i.e., the upper address obtained by excluding the page address A0–A2, has changed, a partial address transition signal (referred to as a "PATD signal" below) is generated. The circuitry in the memory chip 100 operates based on WATD signals and PATD signals. WATD signals are used in order to determine the timing of the internal operations of the memory chip, for example. PATD signals are used to arbitrate between external access and internal refresh operations.

The chip select signal #CS is a signal used to control the operating states of the memory chip 100. FIG. 2 is an explanatory drawing showing the different operating states of the memory chip 100 according to the signal level of the chip select signal #CS. In this Specification, "H" level represents the "1" level among the two signal value levels, while "L" level represents the "0" level.

When the chip select signal #CS is at L level (active), the read/write operation cycle (referred to below simply as "operation cycle" or "read/write cycle") is performed. External access is enabled during the operation cycle, and internal refresh is performed at appropriate times.

When the chip select signal #CS is at H level (inactive), the memory chip 100 is set to a standby state. In the standby state, because external access is prohibited, all word lines are not activated. However, when internal refresh is performed, the word line specified by a refresh address is activated.

The refresh operation is performed based on a first refresh mode during the operation cycle and based on a second refresh mode during the standby state. In the first refresh mode, the refresh operation is commenced synchronously with the PATD signal after the refresh timer 110 issues a refresh timing signal. Here, "synchronous" does not necessarily mean that a signal is issued at the same moment as the reference signal (the PATD signal, for example), but means that the time of its issuance maintains a certain temporal relationship to an edge of the reference signal. In the second refresh mode, the refresh operation starts immediately after the refresh timer 110 issues the refresh timing signal. Because the refresh operation is performed asynchronously with the PATD signal in the second refresh mode, input for the address A0–A20 is not required. The memory chip 100 thus carries out refresh based on two different operating modes that are appropriate for two different operating states. In this embodiment, in order to enable page mode access to be executed efficiently, execution of the refresh operation can be delayed a plurality of times. The refresh operations carried out in accordance with these two refresh modes will be described in more detail below.

During the operation cycle, the write cycle is carried out when the write enable signal #WE switches to L level, while the read cycle is carried out when the output enable signal #OE switches to L level. The lower byte enable signal #LB and upper byte enable signal #UB are control signals used to command execution of reading or writing of only one byte among the upper byte or lower byte of one word (16 bits). For example, when the lower byte enable signal #LB is set to L level and the upper byte enable signal #UB is set to H level, reading or writing of only the lower 8 bits of one word is carried out. The power supply terminals are not shown in FIG. 1.

FIGS. 3(a)–3(g) are timing charts showing the basic operations performed by the memory chip 100. The determination as to which of the two operating states shown in FIG. 2 (operation or standby) is active is made from time to time in accordance with changes in the chip select signal #CS.

The first three cycles shown in FIGS. 3(a)–3(g) are operation cycles. During operation cycles, either reading (read cycle) or writing (write cycle) is performed in accordance with the levels of the write enable signal #WE and the output enable signal #OE. The shortest cycle Tc for the WATD signal (i.e., the shortest change cycle for the address A0–A20) corresponds to the cycle time for the memory chip 100 (hereinafter also termed the "cycle period"). The cycle time Tc is set to fall within a range of about 50 ns–100 ns, for example.

Figure 3:
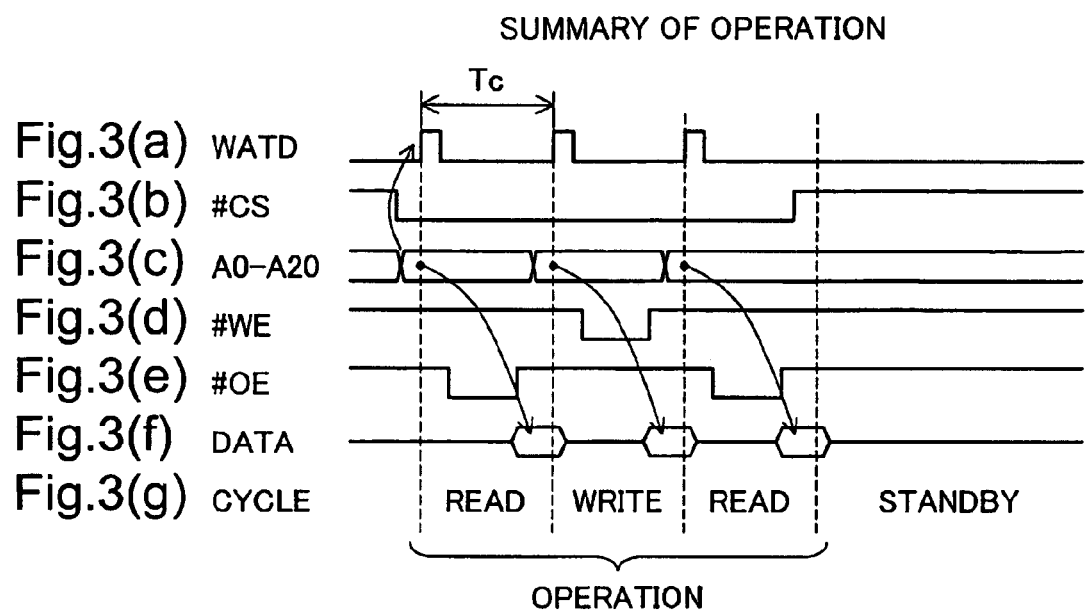
FIGS. 3(a)–3(g) are timing charts showing basic operations performed by the memory chip 100.

When the chip select signal #CS rises to H level, the memory chip 100 is set to the standby state. No WATD signals are generated during the standby state, as shown in FIG. 3(a).

Figure 4:
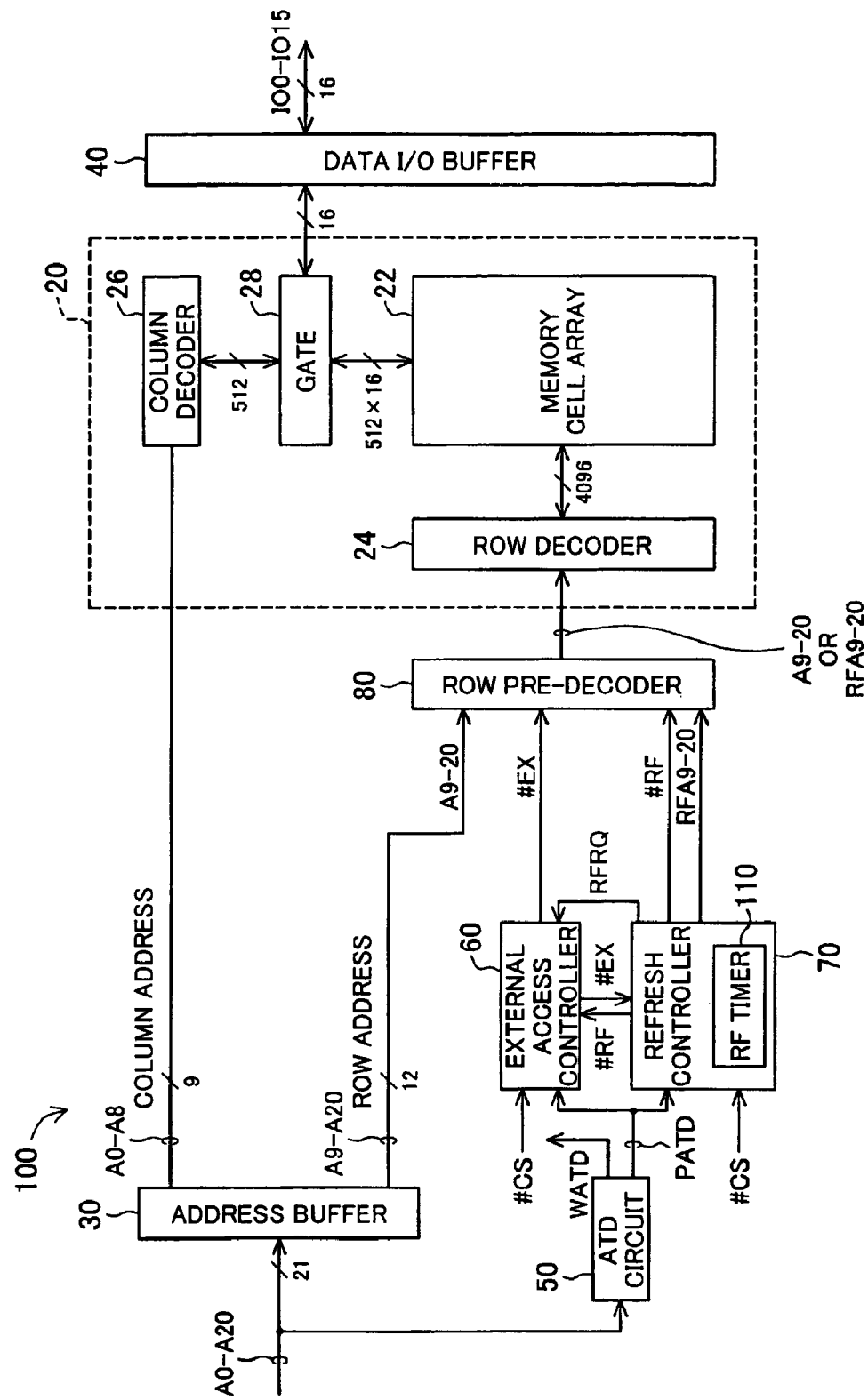
FIG. 4 is a block diagram showing overall internal construction of the memory chip 100.

A-2. General internal construction of memory chip: FIG. 4 is a block diagram showing the overall internal construction of the memory chip 100. The memory chip 100 comprises a memory block 20, an address buffer 30 and a data I/O buffer 40.

The memory block 20 comprises a memory cell array 22, a row decoder 24, a column decoder 26 and a gate 28. The memory cell array 22 has the same construction as that of a memory cell array for a typical DRAM. Namely, in the memory cell array 22, a plurality of memory cells of the type having one transistor and one capacitor are arrayed in a matrix configuration. A word line and a pair of bit lines (also referred to as a "data line pair") are connected to each memory cell. The row decoder 24 includes a row driver and selects and activates one of the plurality of word lines in the memory cell array 22 according to a given row address. The column decoder 26 includes a column driver and simultaneously selects bit line pairs for one word (16 bits) among the plurality of bit line pairs in the memory cell array 22 according to a given column address. The gate 28 includes a reading circuit and a writing circuit, and enables data to be exchanged between the data I/O buffer 40 and the memory cell array 22. In addition, a precharge circuit, a sense amplifier and other components not shown are also disposed in the memory block 20.

The address buffer 30 is a circuit that supplies the 21-bit address A0–A20 supplied from the external device to other internal circuits. The data for one word (16 bits) selected by the row address A9–A20 and the column address A0–A8 is read or written via the data I/O buffer 40.

The memory chip 100 further comprises an ATD circuit 50, an external access controller 60, a refresh controller 70 and a row pre-decoder 80. The memory chip 100 includes, in addition to the circuits shown in FIG. 4, a controller that controls the operating states of the chip's internal circuitry according to the chip select signal #CS, as well a controller that controls the I/O state according to the various enable signals #WE, #OE, #LB and #UB, but these components are not shown for convenience.

The ATD circuit 50 detects whether or not one or more bits of the 21-bit address A0–A20 supplied from the external device has changed, and generates a WATD signal if a change is detected. The WATD signal is used to determine the timing of the internal operations of the memory chip. Furthermore, the ATD circuit 50 detects whether or not one or more bits in the 18-bit upper address A3–A20 has changed, and generates a PATD signal if a changed is detected. The PATD signal is used to arbitrate between external access and internal refresh operations.

The external access controller 60 outputs external access execution signal #EX and controls external access. The refresh controller 70 outputs the refresh address RFA9–RFA20 and refresh execution signal #RF, and controls refresh. During an operation cycle, the two controllers 60, 70 arbitrate between external access and internal refresh. This arbitration is carried out by setting the signal levels of the external access execution signal #EX and the refresh execution signal #RF.

Chip select signals #CS and PATD signals are supplied to the external access controller 60 and the refresh controller 70. Furthermore, refresh request signals RFRQ and refresh execution signals RF are supplied to the external access controller 60 by the refresh controller 70, and external access execution signals #EX are supplied to the refresh controller 70 by the external access controller 60.

When external access is requested, the external access controller 60 generates an external access execution signal #EX. Specifically, if the chip select signal #CS is active (i.e., during an operation cycle), the external access controller 60 determines that external access has been requested. The external access controller 60 then sets the external access execution signal #EX to active in response to the issuance of a PATD signal. However, where refresh has been requested when a PATD signal is issued, the external access controller 60 executes external access after refresh is completed. Specifically, where a refresh request signal RFRQ is active when a PATD signal is issued, the external access controller 60 sets the external access execution signal #EX to active after the refresh execution signal #RF has changed from active to inactive.

The refresh controller 70 issues a refresh execution signal #RF when a refresh is requested by the refresh timer 110. However, in this embodiment, the issuance of a refresh execution signal #RF can be delayed a plurality of times. The refresh controller 70 will be described in more detail below.

The row pre-decoder 80 (see FIG. 4) selects either a row address A9–A20 or a refresh address RFA9–RFA20 in response to the level of the external access execution signal #EX and the refresh execution signal #RF, and supplies the selected address to the row decoder 24. Specifically, if the external access execution signal #EX is active, the row pre-decoder 80 supplies the row address A9–A20 given by the external device to the row decoder 24. On the other hand, if the refresh execution signal #RF is active, the row pre-decoder 80 supplies the refresh address RFA9–RFA20 given by the refresh controller 70 to the row decoder 24. When either the row address A9–A20 or the refresh address RFA9–RFA20 is supplied by the row pre-decoder 80, the row decoder 24 activates a single word line selected by the address A9–A20 or RFA9–RFA20.

Figure 5:
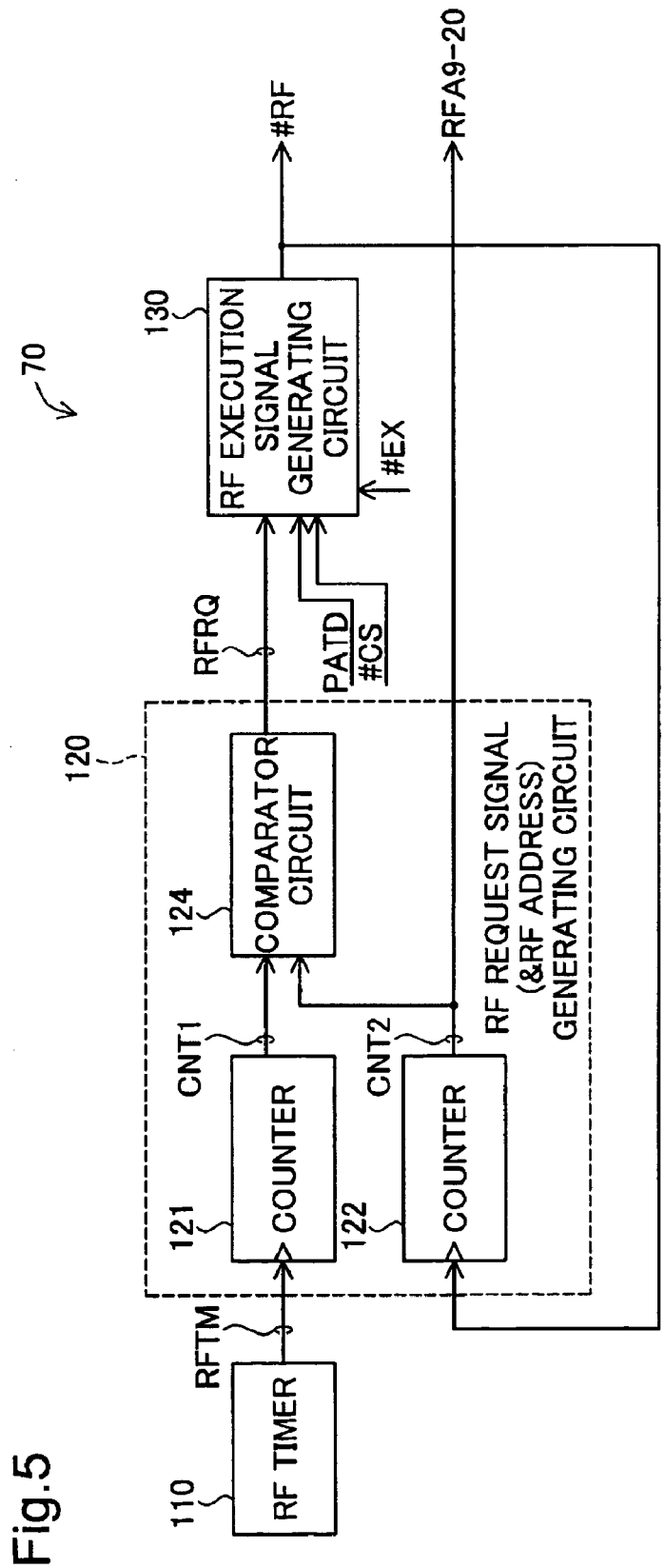
FIG. 5 is a block diagram showing internal construction of a refresh controller 70.

A-3. Internal construction of refresh controller: FIG. 5 is a block diagram showing the internal construction of the refresh controller 70. As shown in the drawing, the refresh controller 70 comprises a refresh timer 110, a refresh request signal/refresh address generating circuit 120 and a refresh execution signal generating circuit 130.

The refresh timer 110 generates a refresh timing signal RFTM according to a predetermined refresh cycle. The refresh timer 110 includes a ring oscillator, for example. The refresh period is set at about 32 $\mu$s, for example.

The refresh request signal/refresh address generating circuit (also termed simply the "refresh request signal generating circuit" below) 120 generates refresh request signals RFRQ in response to the refresh timing signals RFTM supplied by the refresh timer 110. The refresh request signal RFRQ indicates a request for the execution of refresh. The refresh request signal generating circuit 120 further generates a refresh address RFA9–RFA20.

The refresh request signal generating circuit 120 includes two counters 121, 122 and a comparator circuit 124.

The first counter 121 counts the number of times that the refresh timing signal RFTM has been generated.

Specifically, the first counter 121 increments the counter value CNT1 by one at each rising edge of the refresh timing signal RFTM. The first counter 121 is a 12-bit counter.

The second counter 122 counts the number of times that the refresh execution signal #RF output by the refresh execution signal generating circuit 130 has been generated. Specifically, the second counter 122 increments the count value CNT2 by one at each rising edge of the refresh execution signal #RF, i.e., more specifically, when the refresh execution signal #RF returns to inactive (H level). The second counter 122 is a 12-bit counter, and the count value CNT2 is used as a refresh address RFA9–RFA20.

The comparator circuit 124 compares the outputs of the two counters 121, 122 and generates a refresh request signal RFRQ in response to the result of the comparison. Specifically, if the two count values CNT1 and CNT2 match, the comparator circuit 124 sets the refresh request signal RFRQ to inactive (L level), and if the two count values CNT1 and CNT2 do not match, the comparator circuit 124 sets the refresh request signal RFRQ to active (H level).

The refresh operation can be delayed a plurality of times using the two counters 121, 122. Specifically, the first count value CNT1 indicates the number of refresh requests, and the second count value CNT2 indicates the number of refresh executions. As a result, the difference between the two count values CNT1 and CNT2 indicates the number of times the refresh operation has been delayed without being performed (i.e., the number of delays). The refresh request signal RFRQ is set to active (H level) depending on the number of delays.

The refresh execution signal generating circuit 130 sets the refresh execution signal #RF to active in response to the refresh request signal RFRQ, the PATD signal, the chip select signal #CS and the external access execution signal #EX. Specifically, if the chip select signal #CS is active (i.e., during an operation cycle), the refresh execution signal generating circuit 130 sets the refresh execution signal #RF to active synchronously with the PATD signal generated after the refresh request signal RFRQ is generated. However, the refresh execution signal #RF is set to active after the external access execution signal #EX has returned to inactive. In addition, if the chip select signal #CS is inactive (i.e., during the standby state), the refresh execution signal generating circuit 130 sets the refresh execution signal #RF to active when the refresh request signal RFRQ is generated. The refresh execution signal #RF returns to inactive after a prescribed period of time has elapsed.

Figure 6:
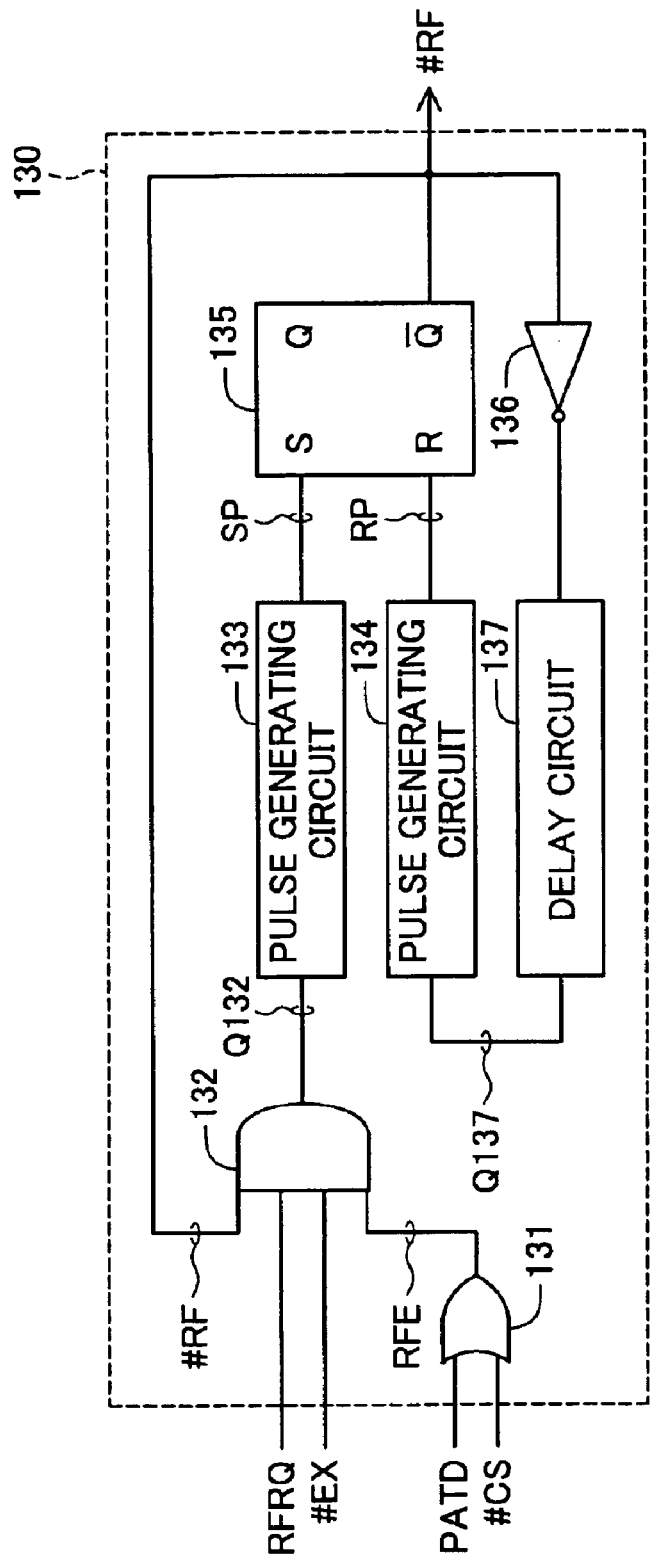
FIG. 6 is a block diagram showing internal construction of a refresh execution signal generating circuit 130 shown in FIG. 5.

FIG. 6 is a block diagram showing the internal construction of the refresh execution signal generating circuit 130 shown in FIG. 5. As shown in the drawing, the refresh execution signal generating circuit 130 includes a two-input OR gate 131, a four-input AND gate 132, two pulse generating circuits 133 and 134, an RS flip-flop 135, an inverter 136 and a delay circuit 137. Each of the two pulse generating circuits 133, 134 generates an H level pulse signal in response to the rising edge of an input signal.

The PATD signal and the chip select signal #CS are supplied to the OR gate 131. During the operation cycle, because the chip select signal #CS is active (L level), the OR gate 131 outputs a PATD signal as a refresh enable signal RFE. In the standby state, on the other hand, because the chip select signal #CS is inactive (H level), the OR gate 131 sets the refresh enable signal RFE to H level at all times.

The refresh execution signal #RF, refresh request signal RFRQ, external access execution signal #EX and refresh enable signal RFE are supplied to the four-input AND gate 132. When the four signals #RF, RFRQ, #EX and RFE are all at H level, the AND gate 132 outputs an H level signal Q132. The pulse generating circuit 133 generates an H level set pulse signal SP at the rising edge of the signal Q132. The set pulse signal SP is supplied to the set terminal S of the RS flip-flop 135.

The RS flip-flop 135 outputs a refresh execution signal #RF from the output terminal #Q. Specifically, when the H level set pulse signal SP is supplied to the set terminal S, the RS flip-flop 135 sets the refresh execution signal #RF to active (L level). The refresh execution signal #RF is supplied to the delay circuit 137 via the inverter 136. The delay circuit 137 delays the inverted refresh execution signal #RF by a predetermined time interval. The period during which the refresh execution signal #RF is active (L level) is determined based on this delay interval. The pulse generating circuit 134 generates an H level reset pulse signal RP at the rising edge of the signal Q137 output by the delay circuit 137. When the H level reset pulse signal RP is supplied to the reset terminal R, the RS flip-flop 135 returns the refresh execution signal #RF to inactive (H level).

By employing this arrangement, the refresh execution signal generating circuit 130 can generate a refresh execution signal #RF a plurality of times during a single refresh cycle. As a result, the delayed refresh operations can be performed in sequence until the number of delayed operations becomes zero. Specifically, during an operation cycle, the refresh execution signal generating circuit 130 can sequentially set the refresh execution signal #RF to active in response to the sequential generation of PATD signals. Furthermore, in the standby state, the refresh execution signal generating circuit 130 can continuously set the refresh execution signal #RF to active at predetermined intervals. Namely, in the standby state, the delayed refresh operations can be carried out in a short amount of time.

A-4. Refresh operation: FIGS. 7(a)–7(k) are timing charts showing the refresh operations during operation cycles. During operation cycles, the chip select signal #CS (see FIG. 7(a)) is set to L level. As shown in the drawing, the rising edges of the refresh timing signal RFTM (see FIG. 7(b)) are formed at times t11–t16.

Immediately before time t11, the first count value CNT1 (see FIG. 7(c)) and the second count value CNT2 (see FIG. 7(d)) match. As a result, the refresh request signal RFRQ (see FIG. 7(e)) is set to L level. When the refresh timing signal RFTM rises at time t11, the first count value CNT1 is incremented by one. When this occurs, because the count values CNT1 and CNT2 no longer match, and more specifically, because there is a discrepancy of one between the two count values, the refresh request signal RFRQ is set to H level.

Figure 7:
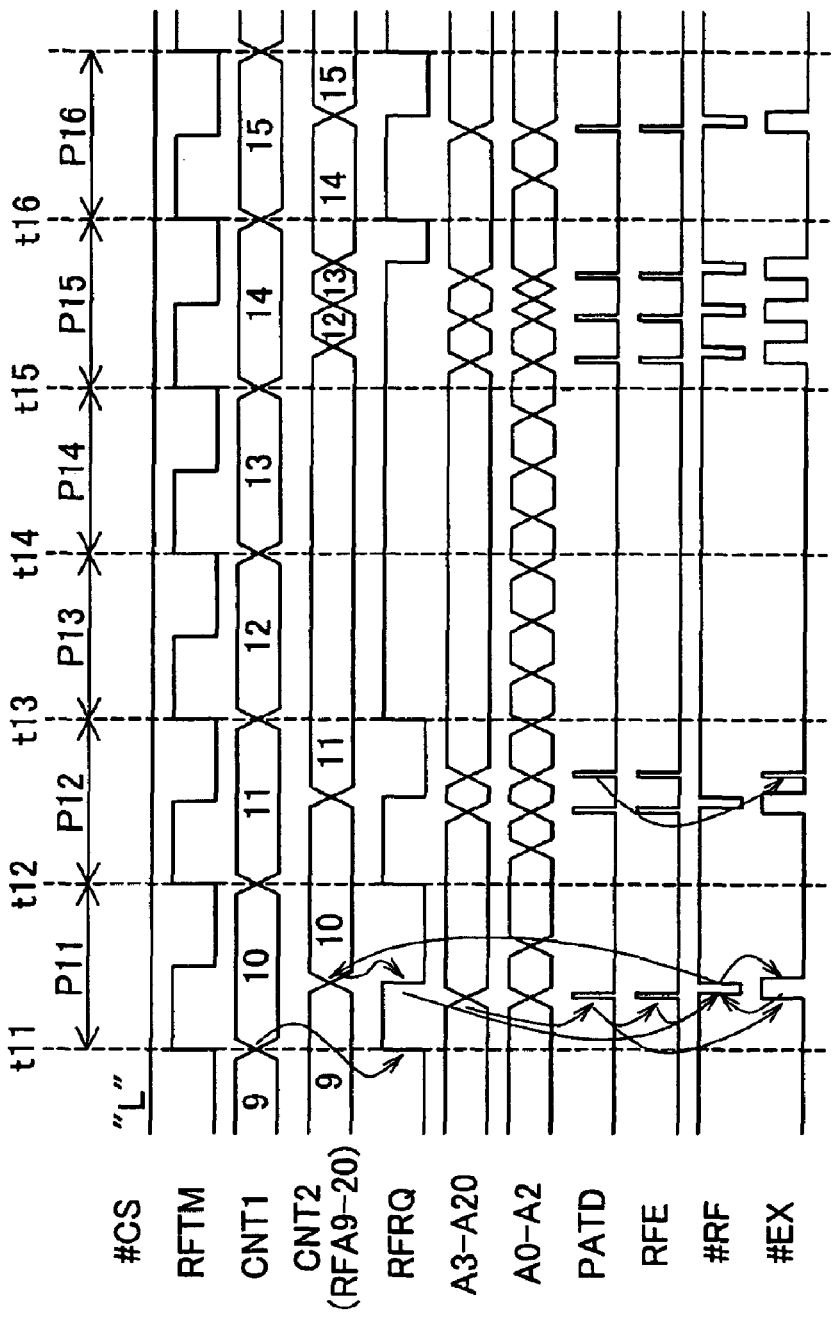
FIGS. 7(a)–7(k) are timing charts showing refresh operations during operation cycles.

When the refresh request signal RFRQ is at H level, if there is a change in the upper address A3–A20 (see FIG. 7(f), the PATD signal (see FIG. 7(h)) is set to H level, and consequently the refresh enable signal RFE (see FIG. 7(i)) is also set to H level. When the PATD signal changes to H level, the external access execution signal #EX is changed to H level (inactive). The refresh execution signal #RF is then set to L level (active) in response to the rising edge of the refresh enable signal RFE. When this occurs, a refresh operation is performed to the memory cells for one row (in FIG. 7, the memory cells for row "9") specified by the second count value CNT2 (i.e., the refresh address RFA9–RFA20). When the refresh execution signal #RF returns to H level after a predetermined period of time has elapsed, the second count value CNT2 is incremented by one. When this occurs, because the two count values CNT1 and CNT2 match, the refresh request signal RFRQ returns to L level. Furthermore, when the refresh execution signal #RF returns to H level, the external access execution signal #EX is set to L level (active). When this occurs, external access of the memory cells specified by an address A0–A20 is carried out. More specifically, the word line specified by the row address A9–A20 is activated. Reading or writing of the data corresponding to the target memory cells is then performed via the bit line pairs specified by the column address A0–A8.

During the period P11, there is a change in the lower address (page address) A0–A2 (see FIG. 7(g)) after the external access execution signal #EX has changed to L level. However, because the upper address A3–A20 does not change, the PATD signal is maintained at L level. When this occurs, the word line specified by the row address A9–A20 is maintained in the activated state. Reading or writing of the data is then carried out using other bit line pairs specified by the column address A0–A8. As described above, the external access performed by changing the active column address while maintaining the word line specified by the row address A9–A20 in the activated state constitutes the page mode access referred to above.

During the period P12, because the upper address A3–A20 changes twice, the PATD signal is generated twice. When the first PATD signal is generated, because the refresh request signal RFRQ is set to H level, the refresh execution signal #RF is set to L level (active), as it is during the period P11. However, when the second PATD signal is generated, because the refresh request signal RFRQ is set to L level, the refresh execution signal #RF is maintained at H level (inactive). When the second PATD signal is generated, the external access execution signal #EX is first set to H level (inactive) and is then set once more to L level (active).

The first count value CNT1 is incremented by one at time t13. However, a PATD signal is not generated during the period P13. In addition, the first count value CNT1 is also incremented by one at time t14, but a PATD signal is not generated during the period P14. The first count value CNT1 is also incremented by one at time t15. As a result, the difference between the two count values CNT1, CNT2 after time t15 is 3. Namely, immediately after time t15, refresh has been delayed three times.

During the period P15, because the upper address A3–A20 changes three times, the PATD signal is generated three times. Accordingly, during the period P15, the refresh execution signal #RF is set to L level (active) three times and the refresh operation is performed three times sequentially. Consequently, the two count values CNT1, CNT2 match at the end of the period P15.

Figure 8:
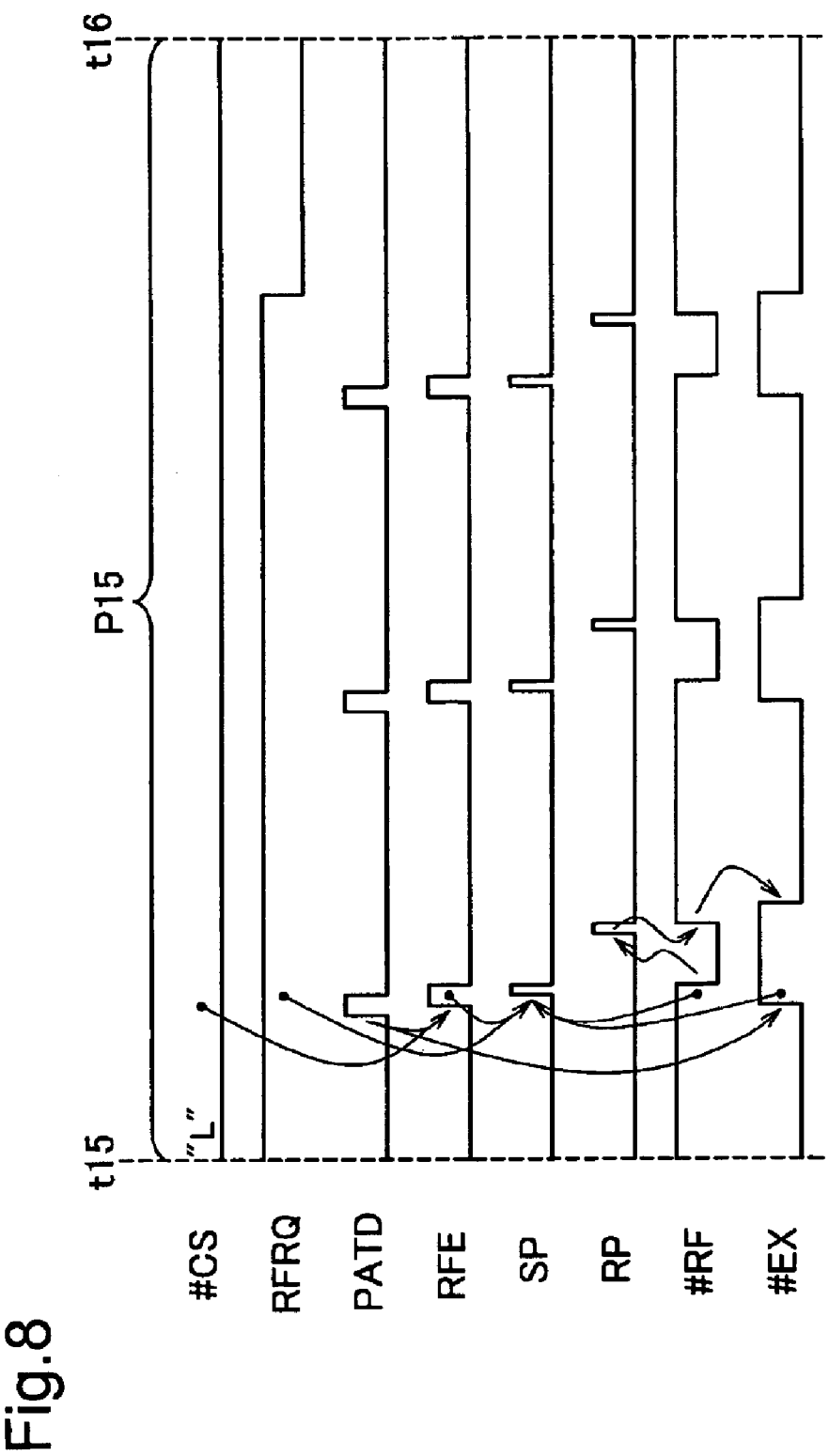
FIG. 8 is a timing chart showing in detail the refresh operations occurring during period P15 shown in FIG. 7.

FIG. 8 is a timing chart showing in detail the refresh operations occurring during the period P15 shown in FIG. 7. FIG. 8 shows the six signals #CS, RFRQ, PATD, RFE, #RF and #EX shown in FIGS. 7(a), 7(e), 7(h), 7(i), 7(j) and 7(k), as well as the set pulse signal SP and the reset pulse signal RP supplied to the RS flip-flop 135 shown in FIG. 6.

As described with reference to FIG. 6, when the chip select signal #CS is at L level, a refresh enable signal RFE is generated in response to the PATD signal. Furthermore, the external access execution signal #EX is set to H level at the rising edge of the PATD signal. As a result, when the refresh enable signal RFE is set to H level, the refresh execution signal #RF, the refresh request signal RFRQ and the external access execution signal #EX are set to H level. When this occurs, an H level set pulse signal SP is generated, and as a result, the refresh execution signal #RF is set to L level (active). When an H level reset pulse signal RP is then generated after a predetermined period of time has elapsed, the refresh execution signal #RF returns to H level (inactive). When the refresh execution signal #RF returns to H level, the external access execution signal #EX is set to L level (active).

During the period P15, this operation is carried out repeatedly until the refresh request signal RFRQ returns to L level, i.e., until the two count values CNT1, CNT2 match.

During the period P16 (see FIG. 7), a PATD signal is generated once and the refresh execution signal #RF is set to L level once, similar to during the period P11.

FIGS. 9(a)–9(k) are timing charts showing the refresh operations carried out in the standby state. While the operations performed during the periods P21–P24 in FIGS. 9(a)–9(k) are the same as the operations performed during the periods P11–P14 shown in FIGS. 7(a)–7(k), the operations executed during the periods P25 and P26 are different. Specifically, during the periods P25 and P26, the chip select signal #CS is changed to H level, thereby changing the operating state to the standby state.

During the standby state, external access is not executed. Specifically, there is no change in the address A0–A20, and the PATD signal is maintained at L level. The external access execution signal #EX is thus maintained at H level (inactive).

As described above in connection with FIG. 7, immediately after time t25, there is a difference of 3 between the two count values CNT1 and CNT2. During an operation cycle, as shown in the period P15 of FIG. 7, upon the generation of the PATD signals, the refresh execution signal #RF and external access execution signal #EX are set three times to L level (active) alternately. However, during the standby state, as shown in the period P25 of FIG. 9, the refresh execution signal #RF is set to L level three times continuously.

Figure 9:
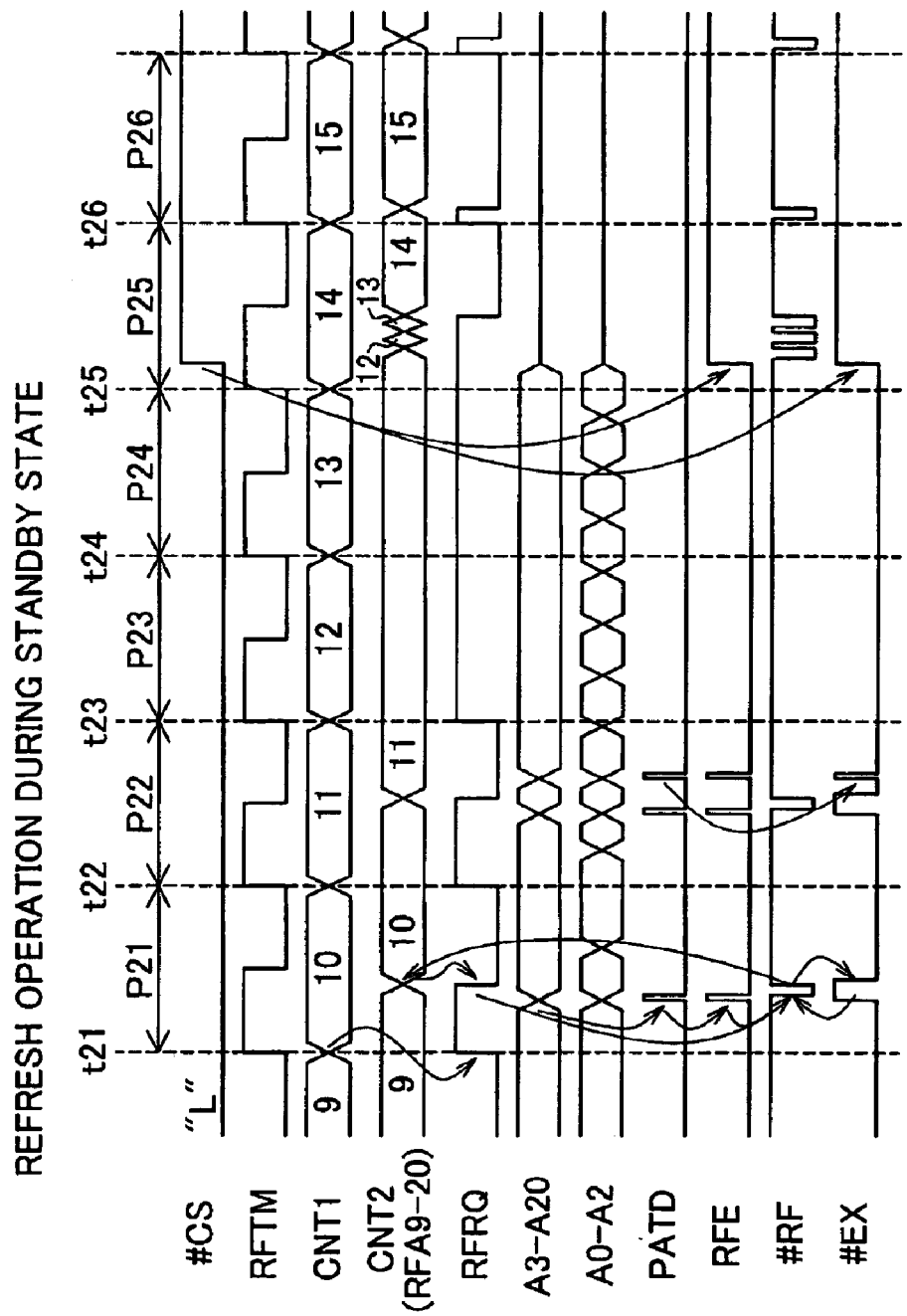
FIGS. 9(a)–9(k) are timing charts showing refresh operations carried out in standby state.
Figure 10:
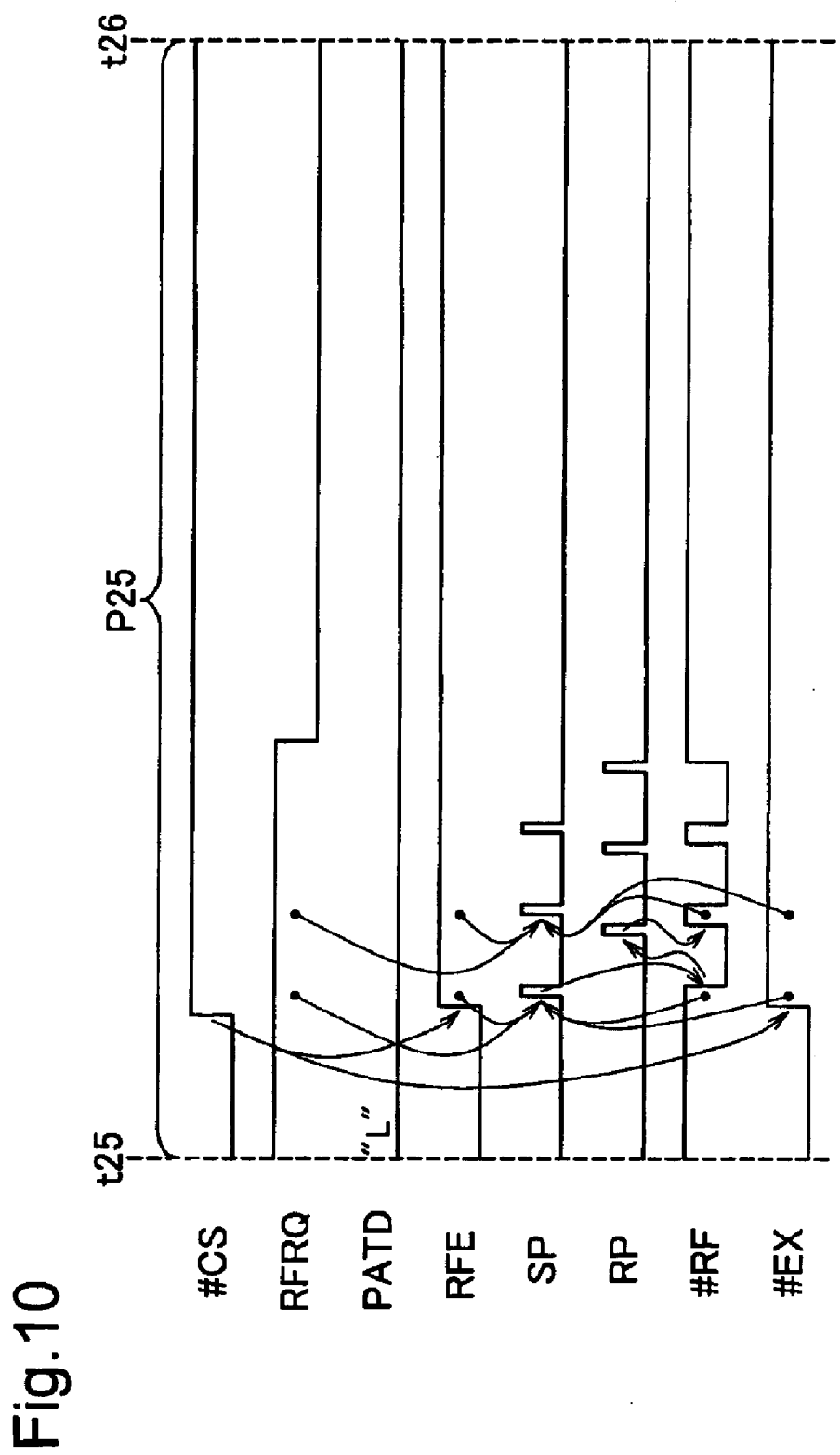
FIG. 10 is a timing chart showing in detail the refresh operations occurring during period P25 shown in FIG. 9.

FIG. 10 is a timing chart showing in detail the refresh operations occurring during period P25 shown in FIG. 9. FIG. 10 shows the eight signals #CS, RFRQ, PATD, RFE, SP, RP, #RF and #EX, similar to FIG. 8.

During period P25, when the chip select signal #CS is changed to H level, the external access execution signal #EX is set to H level (inactive) and the refresh enable signal RFE is also set to H level. When this occurs, the refresh execution signal #RF and the refresh request signal RFRQ are also set to H level. Consequently, an H level set pulse signal SP is generated, and as a result, the refresh execution signal #RF is set to L level (active). When an H level reset pulse signal RP is generated after a predetermined period of time has elapsed, the refresh execution signal #RF returns to H level (inactive). When this occurs, because the refresh request signal RFRQ is maintained at H level, the refresh execution signal #RF is once more set to L level (active).

During the period P25, this refresh operation is executed continuously until the refresh request signal RFRQ returns to L level, i.e., until the tow count values CNT1, CNT2 match.

During the period P26 (see FIG. 9), when the refresh timing signal RFTM rises at time t26, the first count value CNT1 is incremented by one. When this occurs, because the two count values CNT1 and CNT2 no longer match, the refresh request signal RFRQ is set to H level. When the refresh request signal RFRQ is set to H level, the refresh execution signal #RF is immediately set to L level (active).

As described above, in this embodiment, the period between the generation of a refresh timing signal and the generation of a corresponding refresh execution signal is permitted to equal or exceed one refresh cycle. Because the refresh controller 70 includes two counters 121 and 122, the refresh operation can be delayed a plurality of times. In addition, the refresh controller 70 is configured to generates the refresh execution signal #RF two or more times during one refresh timing signal RFTM period if the number of delays is two or more, thereby executing the delayed refresh operations later. Specifically, the delayed refresh operations can be executed together during one refresh cycle (for example, during the period P15 or the period P25). Namely, by employing this embodiment, the long cycle limitation can be mitigated.

Figure 11:
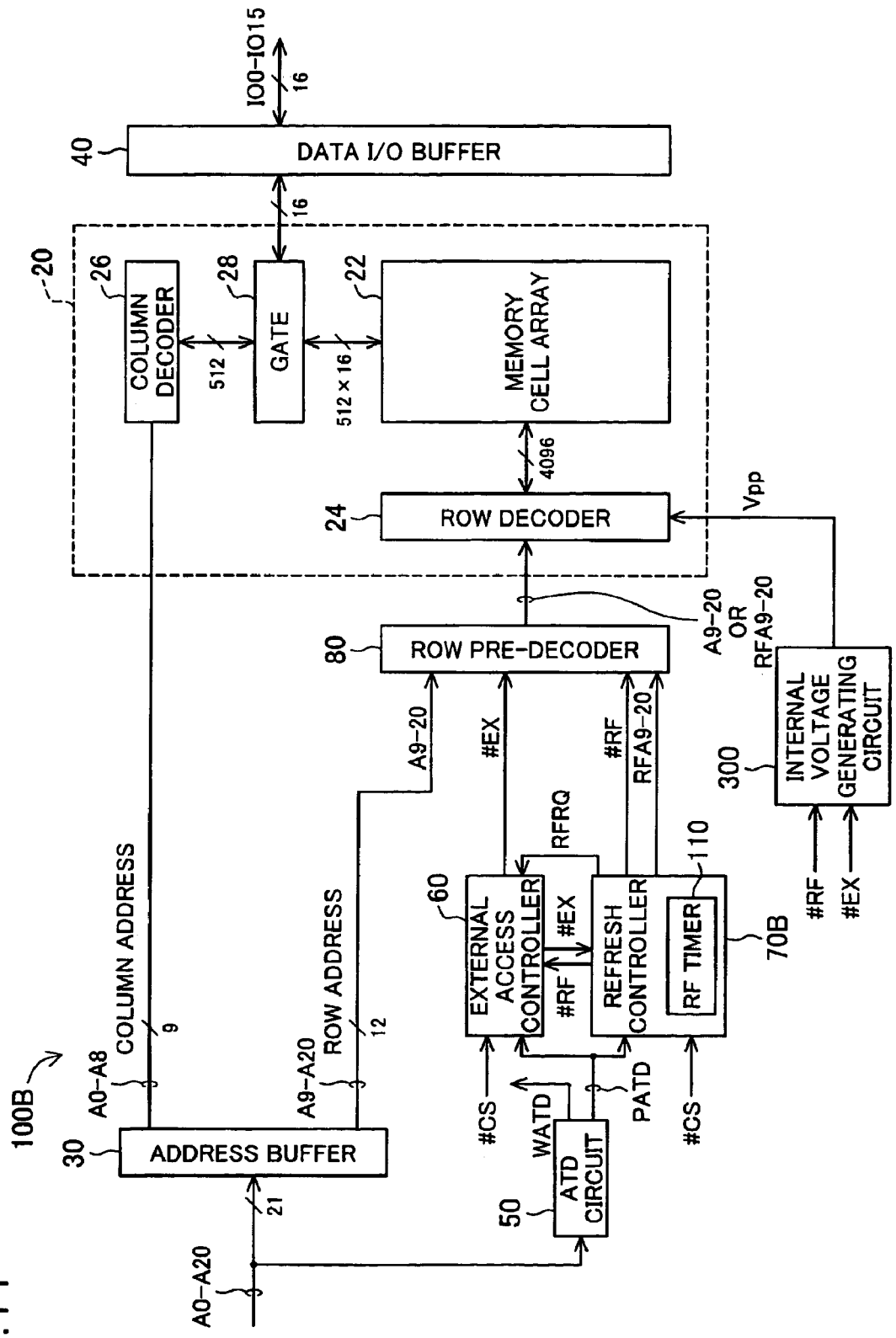
FIG. 11 is a block diagram showing overall internal construction of a memory chip 100B in accordance with a second embodiment.

B. Second Embodiment:

FIG. 11 is a block diagram showing the overall internal construction of a memory chip 100B in accordance with a second embodiment. FIG. 11 is similar to FIG. 4, but the illustration of an internal voltage generating circuit 300 is added and the refresh controller 70B is modified. The internal voltage generating circuit 300 generates an internal voltage Vpp using the external access execution signal #EX supplied by the external access controller 60 and the refresh execution signal #RF supplied by the refresh controller 70.

Actually, the internal voltage generating circuit 300 generates a plurality of types of internal voltage needed for the operations of the memory chip 100B. However, FIG. 11 is illustrated by focusing on the internal voltage Vpp supplied to the row driver in the row decoder 24.

Figure 12:
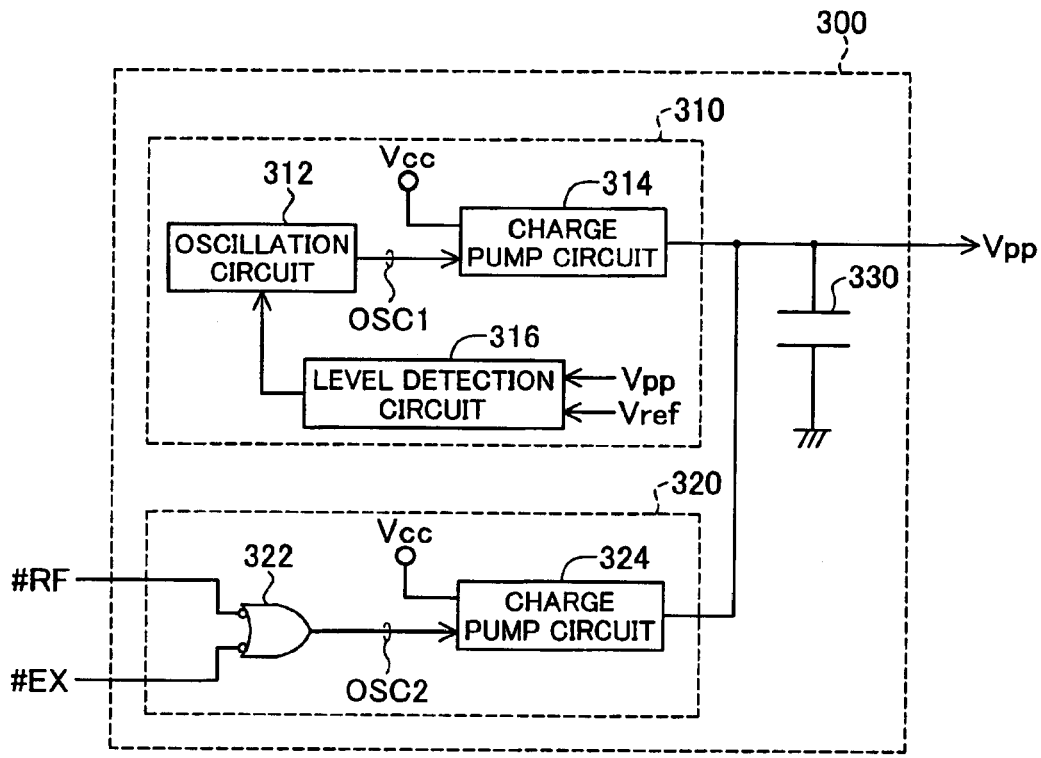
FIG. 12 is a block diagram showing internal construction of an internal voltage generating circuit 300.

FIG. 12 is a block diagram showing the internal construction of the internal voltage generating circuit 300. As shown therein, the internal voltage generating circuit 300 comprises a first voltage generating circuit 310, a second voltage generating circuit 320 and an output capacitor 330. The output terminals of the two voltage generating circuits 310, 320 are connected to one of the terminals of the output capacitor 330.

The first voltage generating circuit 310 includes an oscillation circuit 312, a first charge pump circuit 314 and a level detection circuit 316. The oscillation circuit 312 generates oscillation signals OSC1 and provides them to the charge pump circuit 314. The oscillation circuit 312 consists of a ring oscillator, for example. The period of the oscillation signal OSC1 is set to about 100 ns–200 ns, for example. The charge pump circuit 314 generates internal voltage Vpp using external voltage Vcc. Specifically, the charge pump circuit 314 sequentially increases the internal voltage Vpp by a prescribed voltage amount each time the oscillation signal OSC1 is generated. The internal voltage Vpp increases quickly where the period of the oscillation signal OSC1 is relatively short. The level detection circuit 316 compares the generated internal voltage Vpp and a reference voltage Vref generated from the external voltage Vcc and when the internal voltage Vpp reaches a prescribed voltage, stops the generation of oscillation signals OSC1.

The second voltage generating circuit 320 includes an inverting input-type OR gate 322 and a second charge pump circuit 324. The refresh execution signal #RF and the external access execution signal #EX are supplied to the OR gate 322 while the signal level is in the inverted state. The OR gate 322 generates oscillation signals OSC2 according to the level of the execution signals #RF and #EX. Specifically, when either of the execution signals #RF and #EX is set to L level, i.e., when the refresh operation or the external access operation is performed, the OR gate 322 generates an H level signal. The second charge pump circuit 324 generates an internal voltage Vpp using the external voltage Vcc, similar to the first charge pump circuit 314. However, the electric charge supply capacity of the second voltage generating circuit 320 is higher than that of the first voltage generating circuit 310. Namely, the second voltage generating circuit 320 can efficiently supply to the output capacitor 330 the relatively large amount of electric charge used when the row driver activates a word line. More specifically, the amount of electric charge required for the refresh operation can be efficiently supplemented by using the refresh execution signal #RF, and the amount of electric charge required for the external access operation can be efficiently supplemented by using the external access execution signal #EX. The first voltage generating circuit 310 can quickly supply to the output capacitor 330 the relatively small amount of electric charge used in order to maintain the operation of the row driver.

Incidentally, it is preferred that the internal voltage generating circuit 300 increase the internal voltage Vpp to a predetermined voltage level relatively quickly during power-on processing for the memory chip 100B.

Figure 13:
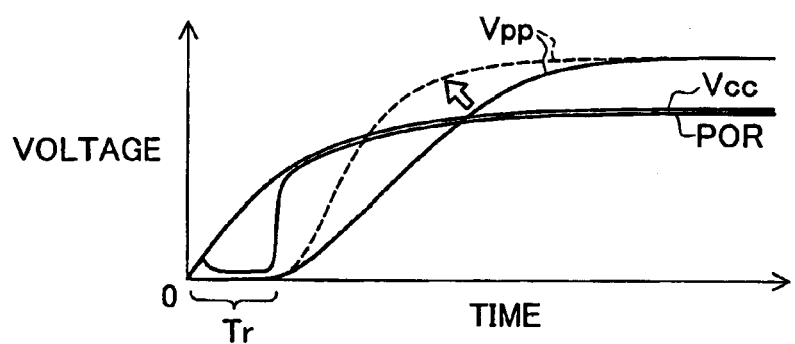
FIG. 13 is an explanatory drawing showing changes in internal voltage Vpp during power-on processing.

FIG. 13 is an explanatory drawing showing changes in the internal voltage Vpp during power-on processing. As shown in the drawing, when the external voltage Vcc rises gradually, power-on reset processing to begin normal operation of the various circuits is executed inside the memory chip. Specifically, a power-on reset signal POR that is set to L level (active) during a predetermined reset period Tr is generated and supplied to the various circuits. When the power-on reset signal POR changes to H level in a step fashion, the reset state is cancelled and the various circuits in the memory chip begin operation. At this time, the two oscillation signals OSC1 and OSC2 shown in FIG. 12 are generated. The internal voltage Vpp then rises gradually to a predetermined voltage, as shown by the solid line in FIG. 13.

While the internal voltage Vpp is rising, the chip select signal #CS must be set to inactive (H level), and external access is prohibited. Therefore, if the time required for the internal voltage Vpp to rise is long, there is a long wait for external access to be enabled. Accordingly, in this embodiment, the refresh controller 70B (see FIG. 11) is constructed such that the internal voltage reaches the predetermined voltage level in a relatively short amount of time, as indicated by the dashed line in the drawing.

Figure 14:
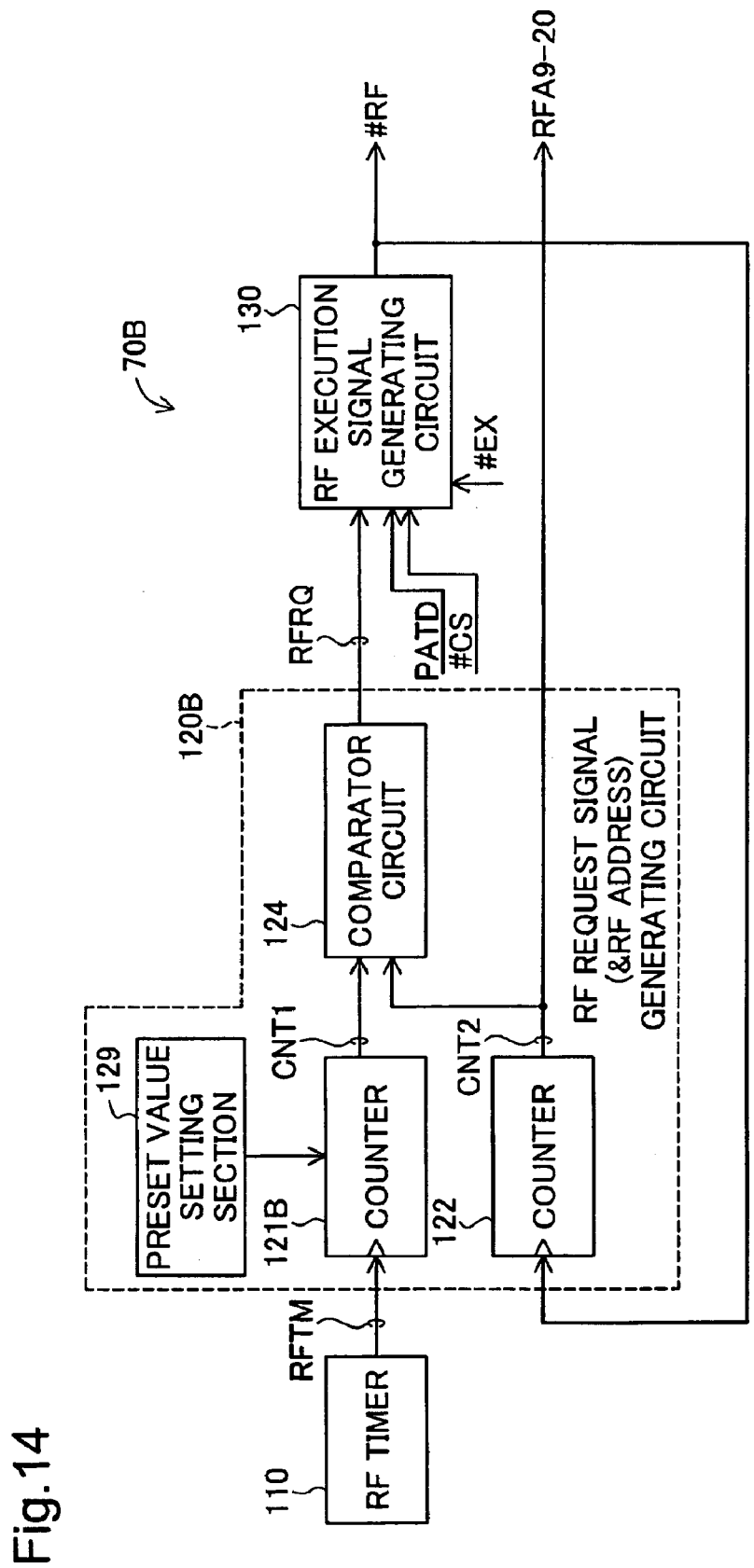
FIG. 14 is a block diagram showing internal construction of a refresh controller 70B.

FIG. 14 is a block diagram showing the internal construction of the refresh controller 70B. FIG. 14 is similar to FIG. 5, but the refresh request signal generating circuit 120B is modified. Specifically, the first counter 121B is changed to include a preset function. In addition, a preset value setting section 129 that sets a predetermined preset value in the first counter 121B is added.

When the power-on reset signal POR (see FIG. 13) shifts to H level, in other words, when the reset state is cancelled, the first counter 121B receives a predetermined preset value given by the preset value setting section 129. As a result, the two counters 121B and 122 can output different count values CNT1 and CNT2 immediately after power-on reset processing is completed. Accordingly, the refresh request signal generating circuit 120B can generate refresh request signals RFRQ while the internal voltage Vpp is increasing after power-on reset processing is completed. The chip select signal #CS is set to inactive while the internal voltage Vpp is rising, as described above. As a result, the refresh execution signal generating circuit 130 can continuously generate refresh execution signals #RF until the two count values CNT1 and CNT2 match, as described above with reference to FIG. 6.

FIGS. 15(*a*) and 15(*b*) are explanatory drawings showing the second oscillation signals. FIG. 15(*a*) shows the second oscillation signal OSC2' that is generated where the first counter 121 having no preset function is used. FIG. 15(*b*)

shows the second oscillation signal OSC2 that is generated where the first counter 121B having a preset function is used.

As shown in FIG. 15(a), where the first counter 121 having no preset function is used, oscillation signals OSC2' having a relatively long period (about 32 μs) are generated after the reset period Tr (see FIG. 13) has ended. This is because where the first counter 121 having no preset function is used, refresh execution signals #RF are generated in response to the period of the refresh timing signal RFTM output by the refresh timer 110.

On the other hand, where the first counter 121B having a preset function is used as shown in FIG. 15(b), oscillation signals OSC2 having a relatively short period (about 50 ns, for example) are generated after the reset period Tr has ended. This is because where the first counter 121B having a preset function is used, refresh execution signals #RF are generated continuously until the two values output by the counters 121B and 122 match. Oscillation signals OSC2 having a relatively long period (about 32 μs) are generated after the two values output by the counters 121B and 122 match, in the same manner as in FIG. 15(a).

As described above, if high-frequency oscillation signals OSC2 are supplied to the second voltage generating circuit 320 having a high electric charge supply capacity while the internal voltage Vpp is rising, the internal voltage Vpp can reach the predetermined voltage level relatively quickly. Consequently, the period of time required for external access to become enabled after power startup (i.e., the power-on processing period) can be reduced considerably.

In this embodiment, at the time of power-on processing, the preset value is set in the first counter 121B, but it may be set in the second counter instead. Also, different preset values may be set in the first and second counters, respectively.

In general, the refresh controller should include a setting section that sets output values from two counters to different values when power-on processing is executed in the semiconductor memory device.

Incidentally, in this embodiment, the second voltage generating circuit 320 generates the internal voltage Vpp using refresh execution signals #RF supplied by the refresh controller 70B. However, instead of this, a pulse signal supply section may be added and the internal voltage Vpp may be generated using pulse signals (corresponding to refresh execution signals #RF) supplied by the pulse signal supply section.

Where the pulse signal supply section is added, the second voltage generating circuit 320 may use the pulses supplied by the pulse signal supply section only during power-on processing. In this case, the second voltage generating circuit 320 will generate the internal voltage Vpp using external access execution signals #EX and refresh execution signals #RF after memory chip power-on processing is completed.

Further, where the pulse signal supply section is used only during power-on processing as described above, an output section that outputs a predetermined value during power-on processing may be used instead of the first counter 121B and the preset value setting section 129. This arrangement offers the advantage that predetermined periodic signals (the refresh timing signals RFTM, for example) need not be supplied to the pulse signal supply section.

However, if the pulse signal supply section includes a periodic signal counter for counting the number of times the predetermined periodic signal is generated and a setting section for setting a predetermined value in the periodic signal counter during power-on processing, pulse signals can be continuously supplied to the second voltage generating circuit during power-on processing and pulse signals can be supplied to the second voltage generating circuit after power-on processing is completed.

Moreover, where the pulse signal supply section includes the periodic signal counter and setting section as described above, the periodic signal counter and pulse signal counter may be constituted by counters used for the execution of refresh operations after power-on processing is completed. If two counters are shared by the refresh controller and the pulse signal supply section in this manner, the circuitry contained in the semiconductor memory device can be reduced in scale to a relatively small size even where the pulse signal supply section is added.

In general, a pulse signal supply section will comprises an output section for outputting a predetermined value during power-on processing and a pulse signal counter for counting the number of times a pulse signal has been generated. During power-on processing, the pulse signal supply section will continuously generate pulse signals until the output value from the output section matches the output value from the pulse signal counter. By employing this arrangement, the pulse supply section can increase the internal voltage to the predetermined voltage level relatively quickly during power-on processing.

The invention is not limited to the examples and embodiments set forth hereinabove, various modifications thereof being possible without departing from the scope and spirit of the invention. Modifications such as the following are possible, for example.

(1) In the above embodiments, a 12-bit counter is used as the first counter 121, but a counter having a smaller number of bits may be used instead. This arrangement enables the refresh controller 70 to be reduced in scale to a relatively small size. For example, the first counter 121 may be a two-bit counter. In this case, the comparator circuit 124 will compare two bits from the first counter 121 with the lower two bits from the second counter 122. Note that, if the first counter 121 is the two-bit counter, the refresh operation can be delayed up to three times.

In general, if the number of bits for the first counter is set to a number smaller than the number of bits for the second counter, the refresh request signal generator will generate refresh request signals using the output from the first counter and part of the output from the second counter.

(2) In the above embodiments, the second count value CNT2 output from the second counter 122 is used as the refresh address RFA9–RFA20. For this reason, the number of bits used by the second counter 122 is set at 12 bits such that the number of bits for the second counter 122 is consistent with the number of rows (4096) included in the memory cell array. However, a separate refresh address generator may be used instead. In this case, the second counter 122 may have a smaller number of bits. However, as described in the above embodiments, if the second count value CNT2 output from the second counter 122 is used as the refresh address RFA9–RFA20, the refresh controller can have a simpler construction since a separate refresh address generator is not needed.

(3) In the above embodiments, the bottom three-bit address A0–A2 of the nine-bit column address A0–A8 is allocated to the page address, but instead of this, the top three-bit address A6–A8 may be allocated to the page address, or a smaller or larger number of bits are allocated to the page address.

In general, at least one bit among the column address will be allocated to the page address. If only the page address changes, the external access controller will maintain a word line selected by the row address in the activated state. In addition, if the word line is maintained in the activated state, the refresh controller will delay the generation of a refresh execution signal until an address bit other than the page address changes.

(4) While the description of the above embodiments involved the execution of page mode access, page mode access may not be performed. In such a case, because the address A0–A20 need not be changed each refresh cycle, in other words, because the same address A0–A20 is permitted to remain in its existing state for one or more refresh periods, the long cycle limitation is mitigated. However, if page mode access is performed, the advantage of the present invention is considerable, and page mode access can be efficiently executed.

(5) In the above embodiments, the refresh request signal generating circuit 120 includes a comparator circuit 124 for comparing the count values CNT1 and CNT2, but it may instead include a subtracter that calculates the difference between the count values CNT1 and CNT2. In this case, the refresh request signal generating circuit will set the refresh request signal RFRQ to active (H level) if the output value from the subtracter is one or more.

Further, in the above embodiments, when a refresh operation is delayed, the refresh request signal RFRQ is maintained as active (H level). However, the refresh request signal RFRQ may instead be set temporarily to inactive (L level) each time a refresh operation is performed and then set once more to active (H level), like the refresh execution signal #RF.

In general, the refresh request signal generator will generate a refresh request signal if the difference between the number of times a refresh timing signal has been generated and the number of times a refresh execution signal has been generated is one or more.

(6) In the second embodiment, the first and second voltage generating circuits 310 and 320 included in the internal voltage generating circuit 300 use the external voltage Vcc to generate an internal voltage Vpp that is higher than the external voltage Vcc. However, the internal voltage generating circuit 300 may use the external voltage Vcc to generate an internal voltage Vpp that is lower than the external voltage Vcc (including negative voltage).

In general, the internal voltage generator will include a charge pump circuit and generates an internal voltage for the semiconductor memory device using voltage supplied externally.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array having dynamic memory cells; and
   a refresh controller that executes refresh operation for the memory cell array,
   wherein the refresh controller comprises:
   a refresh timing signal generator that periodically generates a refresh timing signal used to establish a timing of execution of the refresh operation;
   a refresh request signal generator that generates a refresh request signal indicating a request for the execution of the refresh operation in response to the refresh timing signal; and
   a refresh execution signal generator that generates a refresh execution signal indicating the execution of the refresh operation in response to the refresh request signal and another signal,
   wherein the refresh request signal generator comprises:
   a first counter that counts the number of times the refresh timing signal has been generated; and
   a second counter that counts the number of times the refresh execution signal has been generated,
   and wherein the refresh request signal generator generates the refresh request signal if a difference between the number of times the refresh timing signal has been generated and the number of times the refresh execution signal has been generated is one or more, and
   the refresh execution signal generator is capable of generating two or more of the refresh execution signals within one cycle of the refresh timing signal if the difference is two or more.

2. The semiconductor memory device according to claim 1, further comprising:
   an external access controller that executes an external access operation with respect to a memory cell specified using an external address that is given by an external device, the external address including a row address and a column address,
   wherein if only a predetermined bit included in the column address changes, the external access controller maintains a word line selected by the row address in an active state; and
   if the word line is maintained in the active state, the refresh controller delays the generation of the refresh execution signal until a bit other than the predetermined bit included in the external address changes.

3. The semiconductor memory device according to claim 2,
   wherein if the refresh execution signal is delayed two or more times, the refresh controller sequentially generates the refresh execution signals each time the bit other than the predetermined bit included in the external address changes in a first operation mode in which the external access operation is enabled, and continuously generates the refresh execution signals in a second operation mode in which the external access operation is prohibited.

4. The semiconductor memory device according to claim 1, wherein the number of bits in the second counter is set to match the number of rows included in the memory cell array, and the refresh controller uses an output value from the second counter as a refresh address to specify a row in the memory cell array.

5. The semiconductor memory device according to claim 1, wherein the number of bits in the first counter is set to a number smaller than the number of bits in the second counter, and the refresh request signal generator generates the refresh request signal using an output from the first counter and a part of an output from the second counter.

6. The semiconductor memory device according to claim 1, further comprising:
   an internal voltage generator that includes a charge pump circuit and generates internal voltage for the semiconductor memory device using voltage supplied externally,
   wherein the internal voltage generator generates the internal voltage using the refresh execution signals supplied from the refresh execution signal generator.

7. The semiconductor memory device according to claim 6, wherein the refresh controller further comprises:

a setting section that sets output values from the two counters to different values when power-on processing is executed for the semiconductor memory device, and wherein the refresh controller continuously generates the refresh execution signals when the power-on processing is executed until the output values from the two counters match.

8. A semiconductor memory device comprising:

an internal voltage generator that includes a charge pump circuit and generates internal voltage for the semiconductor memory device using voltage supplied externally; and a pulse signal supply section that supplies pulse signals to the internal voltage generator, wherein the pulse signal supply section comprises:

an output section that outputs a predetermined value when power-on processing for the semiconductor memory device is executed; and a pulse signal counter that counts the number of times the pulse signal has been generated, and wherein the pulse signal supply section continuously generates the pulse signals when the power-on processing is executed until an output value from the output section matches an output value from the pulse signal counter.

9. The semiconductor memory device according to claim 8, wherein the output section comprises:

a periodic signal counter that counts the number of times a predetermined periodic signal has been generated; and a setting section that sets an output value from the periodic signal counter to the predetermined value, wherein the semiconductor memory device further comprises:

a memory cell array having dynamic memory cells, and wherein the periodic signal counter and the pulse signal counter are counters used for execution of refresh operation regarding the memory cell array after the power-on processing is completed.

* * * * *